United States Patent
Hou et al.

(10) Patent No.: US 6,303,455 B1
(45) Date of Patent: Oct. 16, 2001

(54) METHOD FOR MANUFACTURING CAPACITOR

(75) Inventors: Chia-Hsin Hou, Hsinchu Hsien; Tz-Guei Jung; Joe Ko, both of Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/541,450

(22) Filed: Mar. 31, 2000

(51) Int. Cl.[7] .................................................... H01L 21/20
(52) U.S. Cl. ........................ 438/381; 438/239; 438/396; 438/710; 438/241
(58) Field of Search ................................. 438/381, 239, 438/396, 710, 200, 229, 241, 253; 257/755

(56) References Cited

U.S. PATENT DOCUMENTS

| | | | |
|---|---|---|---|
| 5,218,511 | * | 6/1993 | Nariani ................................. 361/313 |
| 5,879,981 | * | 3/1999 | Tanigava ............................... 438/241 |
| 6,015,732 | * | 1/2000 | Williamson et al. ................. 438/253 |
| 6,147,405 | * | 11/2000 | Hu ......................................... 257/755 |
| 6,207,995 | * | 3/2001 | Gardner et al. ....................... 257/344 |

* cited by examiner

Primary Examiner—Matthew Smith
Assistant Examiner—V. Yevsikov
(74) Attorney, Agent, or Firm—Thomas, Kayden, Horstemeyer & Risley

(57) ABSTRACT

A method for manufacturing a capacitor is provided in the present invention. The bottom electrode of the capacitor is a polysilicon layer, and the top electrode of the capacitor is a silicide layer. Since depletion regions cannot be generated in the metal layer or the suicide layer, and the resistivity of the metal layer or the silicide layer is smaller than a conventional polysilicon layer, so that operating speed and frequency of the capacitor are both increased.

15 Claims, 1 Drawing Sheet

METHOD FOR MANUFACTURING CAPACITOR

BACKGROUND OF THE INVENTION

1. Field of the Invention

The present invention relates to a semiconductor device. More particularly, the present invention relates to a method for manufacturing a capacitor.

2. Description of the Related Art

Most capacitors that are formed in conjunction with other semiconductor devices have a pair of polysilicon electrodes. However, the polysilicon electrodes have some drawbacks including the formation of a depletion region whose thickness may vary. A variable thickness often leads to a variation of capacitance and a degradation of device performance. In the current state of technology, variation in depletion layer thickness often results in an even greater variation in capacitance because the inter-layer dielectric layer has become thinner due to miniaturization.

In general, the polysilicon electrodes of a capacitor are doped (for example, using arsenic or phosphorus ions) to increase electrical conductivity. However, when a voltage is applied to the capacitor, electric charges are induced at the junction between the electrode and the inter-layer dielectric layer. The electric charges near the junction cancel most of the effect of produced by the ionic dopants, thereby creating a depletion region.

The depletion region can be regarded as an extension of the inter-layer dielectric layer. The presence of the depletion region, therefore, increases the effective dielectric layer of the capacitor. In general, the charge storage capacity of a capacitor is inversely proportional to the thickness of the inter-layer dielectric layer. In other words, a capacitor having a thin dielectric layer is able to store a greater number of charges. However, the formation of a depletion layer increases the thickness of the dielectric layer, and hence reduces the capacitance of the capacitor. In addition, thickness of the depletion layer varies according to the voltage V applied to the electrodes. This can lead to a variation of the voltage coefficient ($1/C(dC/dV)$) of a capacitor and hence a de-stabilization of the device. Furthermore, polysilicon has a higher resistivity than other metallic materials. Therefore, polysilicon electrodes often limit the ultimate operating speed and performance of the capacitor.

SUMMARY OF THE INVENTION

The invention provides a method for manufacturing a capacitor to prevent from generating a depletion region in a top electrode of the capacitor.

In another aspect of the invention, the invention provides a method for manufacturing a capacitor whose performance and frequency are both increased.

The invention provides a method for manufacturing a capacitor. The method includes the following steps. A semiconductor substrate with a peripheral circuit region and a memory cell region is provided. An isolation structure is formed in the memory cell region. A gate oxide layer is formed over the substrate apart from the isolation structure. A first polysilicon layer is formed over the gate oxide layer and the isolation structure. A dielectric layer is formed on the first polysilicon layer. A second polysilicon layer is formed on the dielectric layer, and then the second polysilicon layer is patterned to expose a portion of the dielectric layer; the residual second polysilicon layer is above the isolation structure. The exposed dielectric layer is removed to expose a portion of the first polysilicon layer. The first polysilicon layer and the gate oxide layer are patterned to form a bottom electrode above the isolation structure. In the meantime, a polysilicon gate is also formed above the peripheral circuit region. An ion implantation step is performed to form a lightly doped drain region beside the polysilicon gate in the substrate. Spacers are formed on the sidewalls of the polysilicon gate, the residual second polysilicon layer and the bottom electrode, respectively. An ion implantation step is performed to form a source/drain region beside the polysilicon gate in the substrate. A salicidation process is performed to convert the second polysilicon layer entirely into a first silicide layer serving as top electrode of the capacitor, and second silicide layers are formed on the top surface of the polysilicon gate and on the first polysilicon layer, respectively.

In the present invention, the polysilicon layer serves as the bottom electrode of the capacitor, and the silicide layer serves as the top electrode of the capacitor. Since the depletion regions are not to be generated in the metal layer or the silicide layer, and the resistivity of the metal layer or the silicide layer is smaller than a conventional polysilicon layer, the operating speed and frequency of the capacitor are both increased.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
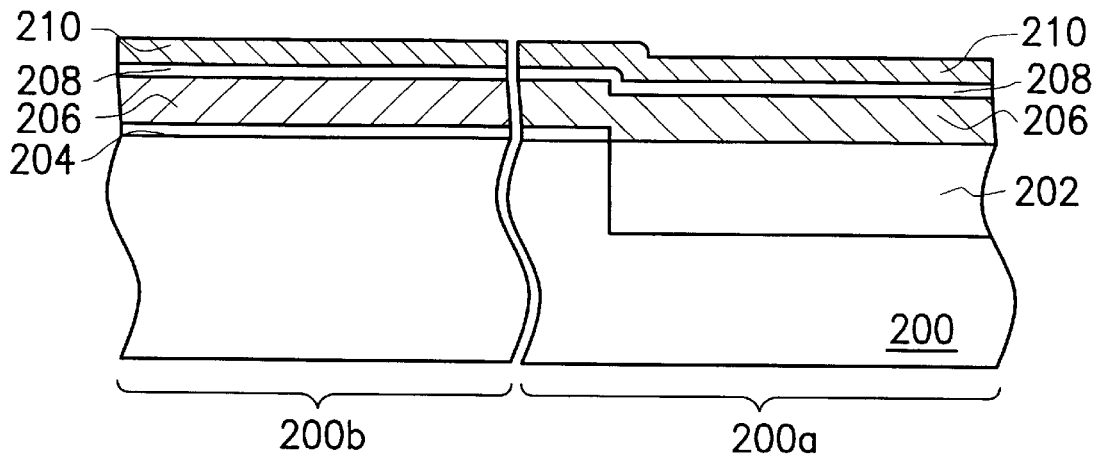
FIGS. 1A through 1C are schematic, cross-sectional views showing the rogression of manufacturing steps for producing a capacitor according to one preferred mbodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
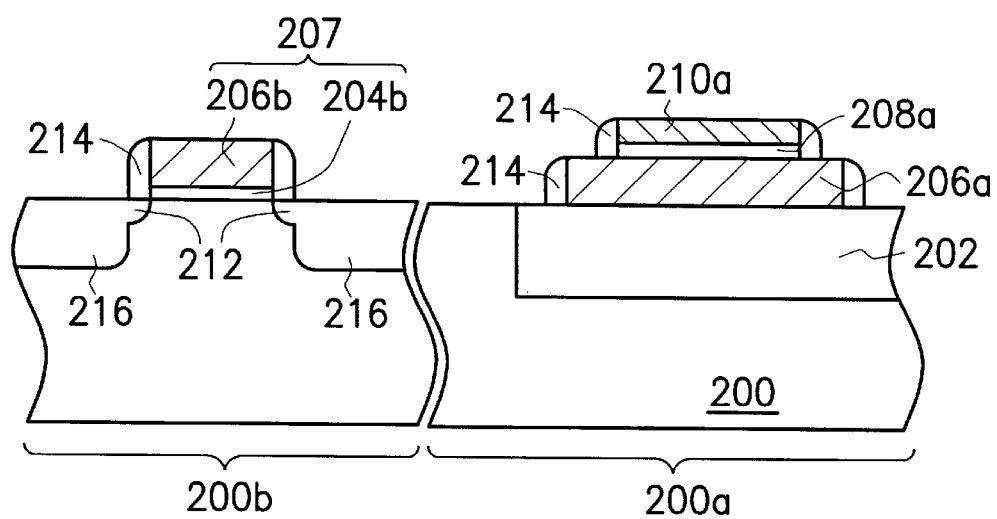
Figure 1C:
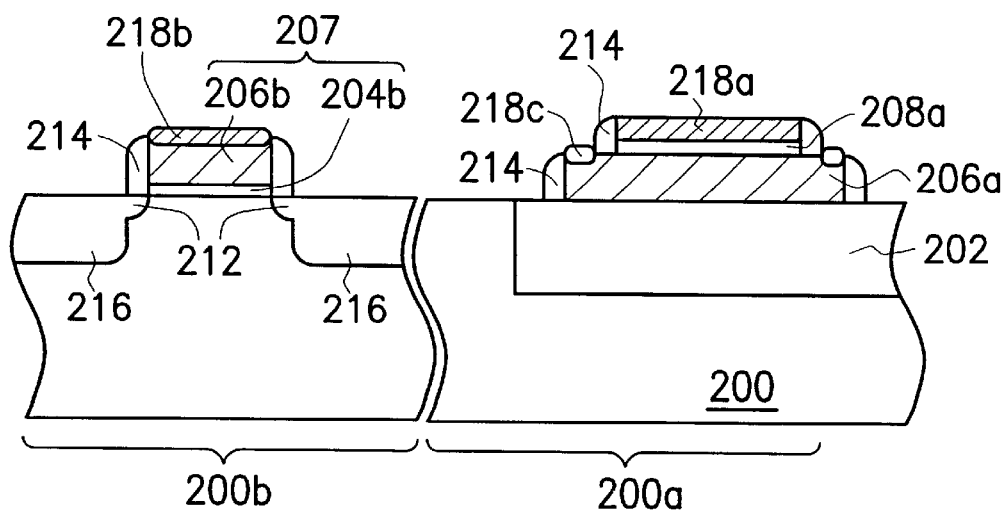

FIGS. 1A through 1C are schematic, cross-sectional views showing the progression of manufacturing steps for producing a capacitor according to one preferred embodiment of this invention. Since a transistor in the peripheral circuit region is formed at the same time, the steps for forming the transistor in the peripheral circuit region are shown in FIGS. 1A through 1C.

As shown in FIG. 1A, a semiconductor substrate 200 divided into a memory cell region 200a and a peripheral circuit region 200b is provided. The memory cell region 200a has an isolation structure 202 such as a field oxide layer or a shallow trench isolation (STI) structure therein. A gate oxide layer 204 is formed over the substrate 200 in the peripheral circuit region 200b and outside the isolation structure 202 in the memory cell region 200a. Then, a polysilicon layer 206 is formed by, for example, chemical vapor deposition (CVD) conformal to the substrate 200. The thickness of the polysilicon layer 206 is about 1500–3000 Å, and the polysilicon layer 206 is preferably doped to increase the conductivity. A dielectric layer 208 is formed on the polysilicon layer 206. The dielectric layer 208 is made of a material such as silicon-oxy-nitride, silicon nitride, silicon oxide or silicon oxide/silicon nitride/silicon oxide layer (ONO) formed by, for example, chemical vapor deposition, and the thickness of the dielectric layer 208 is about 100–500 Å. A polysilicon layer 210 is next formed on the dielectric layer 208. The thickness of the polysilicon layer 210, preferably doped to increase the conductivity, is preferably less than 500 Å.

As shown in FIG. 1B, the polysilicon layer 210 is patterned to form a polysilicon layer 210a in the memory cell region 200a, and then a portion of the dielectric layer 208 exposed by the polysilicon layer 210a is removed to form a dielectric layer 208a in the memory cell region 200a. Next, the polysilicon layer 206 is patterned by, for example, photolithography and etching to form a polysilicon layer 206a in the memory cell region 200a, and a polysilicon layer 206b in the peripheral circuit region 200b is formed at the same time. The polysilicon layer 206a serves as a bottom electrode of a capacitor, and the dielectric layer 208a serves as a dielectric layer of the capacitor. A portion of the gate oxide layer 204 is removed to form a gate oxide layer 204b by using the polysilicon layer 206b as a mask, and then the gate oxide layer 204b and the polysilicon layer 206b constitute a gate 207.

The polysilicon layer 206a and the polysilicon layer 206b are usually formed in the same processing step. Typically, the polysilicon layers 206a and 206b are formed by chemical vapor deposition to deposit a polysilicon layer over the entire substrate 200. Conventional photolithography and etching processes are next carried out to pattern the polysilicon layer. Hence, the polysilicon layer 206a above the isolation structure 202 and the polysilicon gate layer 206b in the peripheral circuit region 200b are formed at the same time. In addition, ions are implanted into the polysilicon layer to increase the conductivity.

The gate 207 serves as an implantation mask, and an ion implantation process is performed to form lightly doped drain regions 212 in the substrate 200. Spacers 214 are then formed on sidewalls of the gate 207, the polysilicon layer 210a and the polysilicon layer 206a, respectively. The spacers 214 can be formed by, for example, the following steps. A chemical vapor deposition process is performed to form an insulation layer (not shown in the FIG. 1B) over the entire substrate 200, and the insulation layer is etched to form the spacers 214 by performing an anisotropic etching operation. A step for forming source/drain regions 216, is then conducted. Since the operation is not directly related to this invention, detailed descriptions are omitted herein.

As shown in FIG. 1C, a salicidation process is performed, and then the second polysilicon layer 210a converts entirely into a silicide layer 218a, and silicide layers 218b, 218c are formed on the top surface of the polysilicon layer 206b and on the top surface of the polysilicon layer 206a, respectively. The silicide layer 218a over the polysilicon layer 206a serves as a top electrode of the capacitor. Each thickness of the silicide layers 218a, 218b, 218c is about 300–500 Å. The method of forming the silicide layers 218a, 218b and 218c includes the following steps. For example, a metal layer made from titanium/titanium nitride (Ti/TiN) is deposited over the substrate 200.

Moreover, the thickness of the titanium layer is about 200 Å, and the thickness of the titanium nitride layer is about 300 Å. Then, a rapid thermal annealing (RTA) process is performed. Preferably, the rapid thermal annealing process includes two steps.

First, an annealing process is performed at a temperature of about 800° C. for a duration of about 30 seconds, and then another annealing process is performed at a temperature of about 950° C. for a duration of about 25 seconds. The duration of the rapid thermal annealing process should be limited to prevent a decrease in the performance of the device. The metal layer only reacts with the polysilicon layers and the source/drain regions to form respectively silicide layers after the rapid thermal annealing process. Apart from the top surface of the polysilicon layer 206a and the top surface of the polysilicon layer 206b, the silicide layer also covers the source/drain regions 216. A portion of the unreacted metal layer is then removed by selective wet etching.

In the invention, the thickness of the polysilicon layer 210a must be controlled; thus, the polysilicon layer 210a can be entirely converted into the silicide layer 218a in the following salicidation process. If the polysilicon layer 210a cannot be entirely converted into the silicide layer 218a, the top electrode of the capacitor is a two-layer structure, which is constructed by the silicide layer 218a and the residual polysilicon layer. Due to the two-layer structure, a depletion layer is generated between the residual polysilicon layer and the dielectric layer 208a. Therefore, the voltage coefficient of the capacitor is varied, and the device is de-stabilized.

In this invention, a polysilicon layer serves as the bottom electrode of the capacitor, a silicide layer serves as the top electrode of the capacitor. Since the depletion regions cannot be generated in the metal layer or the silicide layer, and the resistivity of the metal layer or the silicide layer is smaller than that of a conventional polysilicon layer, so that operating speed and frequency of the capacitor are both increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a capacitor, which is suitable for a substrate with a memory cell region and a peripheral circuit region, wherein the memory cell region has an isolation structure therein, comprising the steps of:

forming a gate oxide layer over the substrate apart from the isolation structure in the memory cell region;

forming a first polysilicon layer over the substrate;

forming a dielectric layer on the first polysilicon layer;

forming a second polysilicon layer on the dielectric layer;

patterning the second polysilicon layer, wherein the residual second polysilicon layer is above the isolation structure;

patterning the dielectric layer by using the residual second polysilicon layer as a mask;

patterning the first polysilicon layer and the gate oxide layer to form respectively a bottom electrode of the capacitor above the isolation structure and a polysilicon gate in the peripheral circuit region, wherein a width of the bottom electrode is larger than that of the residual second polysilicon layer;

forming spacers on sidewalls of the polysilicon gate, the residual second polysilicon layer and the bottom electrode, wherein a portion of a top surface of the bottom electrode is exposed; and forming a first suicide layer and a second silicide layer on the bottom electrode and the polysilicon gate, respectively.

2. The method of claim 1, wherein the first silicide layer and the second silicide layer include titanium silicide.

3. The method of claim 1, wherein the isolation structure includes a shallow trench isolation structure.

4. The method of claim 1, wherein the second polysilicon layer includes doped polysilicon.

5. The method of claim 1, wherein the thickness of the second polysilicon layer is thin so as to be converted entirely into the first silicide layer serving as a top electrode of the capacitor.

6. A method for manufacturing a capacitor, which is suitable for a substrate with a memory cell region and a peripheral circuit region, wherein the memory cell region has an isolation structure therein, comprising the steps of:

forming a gate oxide layer over the substrate apart from the isolation structure in the memory cell region;

forming a first polysilicon layer over the gate oxide layer and the isolation structure;

forming a dielectric layer on the first polysilicon layer;

forming a second polysilicon layer on the dielectric layer;

patterning the second polysilicon layer, wherein the residual second polysilicon layer is above the isolation structure;

patterning the dielectric layer to form a dielectric layer of a capacitor over the isolation structure;

patterning the first polysilicon layer and the gate oxide layer to form respectively a bottom electrode of the capacitor above the isolation structure and a polysilicon gate in the peripheral circuit region, wherein a width of the bottom electrode is larger than that of the residual second polysilicon layer;

forming lightly doped drain regions in the substrate in the peripheral circuit region;

forming spacers on sidewalls of the polysilicon gate, the residual second to polysilicon layer and the bottom electrode, wherein a portion of a top surface of the bottom electrode is exposed;

forming source/drain regions in the substrate in the peripheral circuit region; and forming a first silicide layer and a second silicide layer on the bottom electrode and the polysilicon gate, respectively, wherein the first silicide layer is formed by entirely converting the residual second polysilicon layer.

7. The method of claim 6, wherein the first silicide layer and the second silicide layer include titanium silicide.

8. The method of claim 6, wherein the isolation structure includes a shallow trench isolation structure.

9. The method of claim 6, wherein the second polysilicon layer includes doped polysilicon.

10. A method for manufacturing a capacitor, which is suitable for a substrate with a memory cell region and a peripheral circuit region, wherein the memory cell region has an isolation structure therein, comprising the steps of:

forming a bottom polysilicon electrode above the isolation structure;

forming a dielectric layer on the bottom polysilicon electrode; and forming a silicide top electrode on the dielectric layer, wherein a silicide layer partially covering the bottom polysilicon layer is formed concurrent to the formation of the silicide top electrode.

11. The method of claim 10, wherein the isolation structure includes a shallow trench isolation structure.

12. The method of claim 10, wherein a polysilicon gate is formed in the peripheral circuit region while forming the bottom polysilicon electrode in the memory cell region.

13. The method of claim 12, wherein a silicide layer is formed on a top surface of the polysilicon gate while forming the silicide top electrode.

14. The method of claim 10, wherein the silicide top electrode includes titanium silicide.

15. The method of claim 10, wherein the step of forming the silicide top electrode further comprise:

forming a polysilicon layer on a top surface of the dielectric layer;

forming a metal layer at least covering the polysilicon layer;

performing a rapid thermal process to convert the whole polysilicon layer into a silicide layer serving as the silicide top electrode of the capacitor; and removing the residual metal layer.

* * * * *